United States Patent
Meade et al.

(10) Patent No.: US 8,665,630 B2
(45) Date of Patent: Mar. 4, 2014

(54) MEMORY CELL OPERATION INCLUDING CAPACITANCE

(75) Inventors: Roy E. Meade, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 13/117,889

(22) Filed: May 27, 2011

(65) Prior Publication Data

US 2012/0300530 A1 Nov. 29, 2012

(51) Int. Cl.
*G11C 11/00* (2006.01)

(52) U.S. Cl.
USPC ....... 365/148; 365/158; 365/163; 365/230.06

(58) Field of Classification Search
USPC ............. 365/148, 158, 163, 171, 173, 230.06
See application file for complete search history.

(56) References Cited

U.S. PATENT DOCUMENTS

| | | | |
|---|---|---|---|
| 7,292,469 B2 | 11/2007 | Lee et al. | |
| 7,855,923 B2 | 12/2010 | Li et al. | |
| 7,881,096 B2 | 2/2011 | Zhu et al. | |
| 2007/0133267 A1* | 6/2007 | Cho et al. | 365/163 |
| 2009/0323391 A1* | 12/2009 | Scheuerlein et al. | 365/148 |
| 2010/0110764 A1 | 5/2010 | Sun et al. | |
| 2010/0165726 A1 | 7/2010 | Shepard | |
| 2010/0321977 A1* | 12/2010 | Sekar et al. | 365/148 |

OTHER PUBLICATIONS

Dietrich, Stefan, et al. "A Nonvolatile 2-Mbit CBRAM Memory Core Featuring Advanced Read and Program Control." IEEE Journal of Solid-State Circuits, Apr. 2007, pp. 839-845, vol. 42 No. 4.
Waser, Rainer, et al. "Redox-Based Resistive Switching Memories—Nanoionic Mechanisms, Prospects, and Challenges." Advanced Materials, 2009, pp. 2632-2663, vol. 21.

* cited by examiner

*Primary Examiner* — Thao Bui
(74) *Attorney, Agent, or Firm* — Brooks, Cameron & Huebsch, PLLC

(57) ABSTRACT

Methods, devices, and systems associated with memory cell operation are described. One or more methods of operating a memory cell include charging a capacitor coupled to the memory cell to a particular voltage level and programming the memory cell from a first state to a second state by controlling discharge of the capacitor through a resistive switching element of the memory cell.

28 Claims, 5 Drawing Sheets

MEMORY CELL OPERATION INCLUDING CAPACITANCE

TECHNICAL FIELD

The present disclosure relates generally to semiconductor memory devices and methods, and more particularly, to memory cell operation.

BACKGROUND

Memory devices are typically provided as internal, semiconductor, integrated circuits in computers or other electronic devices. There are many different types of memory, including random access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), conductive bridging random access memory (CBRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix (e.g., array). For example, an access device, such as a diode, a field effect transistor (FET), or bipolar junction transistor (MT), for a memory cell may be coupled to an access line (e.g., a word line) forming a "row" of the array. Each memory cell may be coupled to a data/sense line (e.g., a bit line) in a "column" of the array.

Resistive Memory devices include resistive memory cells that store data based on the resistance level of a resistive switching element. The cells can be programmed to a desired state (e.g., resistance level), for example, by applying sources of energy, such as positive or negative electrical pulses (e.g., current pulses) to the cells for a particular duration. Resistance states may be programmed in accordance with a linear distribution, or a non-linear distribution. As an example, a single level cell (SLC) may represent one of two data states (e.g., logic 1 or 0), which can depend on whether the cell is programmed to a resistance above or below a particular level. Various resistive memory cells can be programmed to multiple different resistance levels corresponding to multiple data states. Such cells may be referred to as multi state cells, multi digit cells, and/or multi level cells (MLCs) and can represent multiple binary digits (e.g., 10, 01, 00, 11, 111, 101, 100, 1010, 1111, 0101, 0001, etc.).

The programmed state of a selected resistive memory cell may be determined (e.g., read), for example, by sensing current through the cell responsive to an applied voltage. The sensed current, which varies based on the resistance level of the memory cell, indicates the programmed state of the cell.

DETAILED DESCRIPTION

Figure 1:
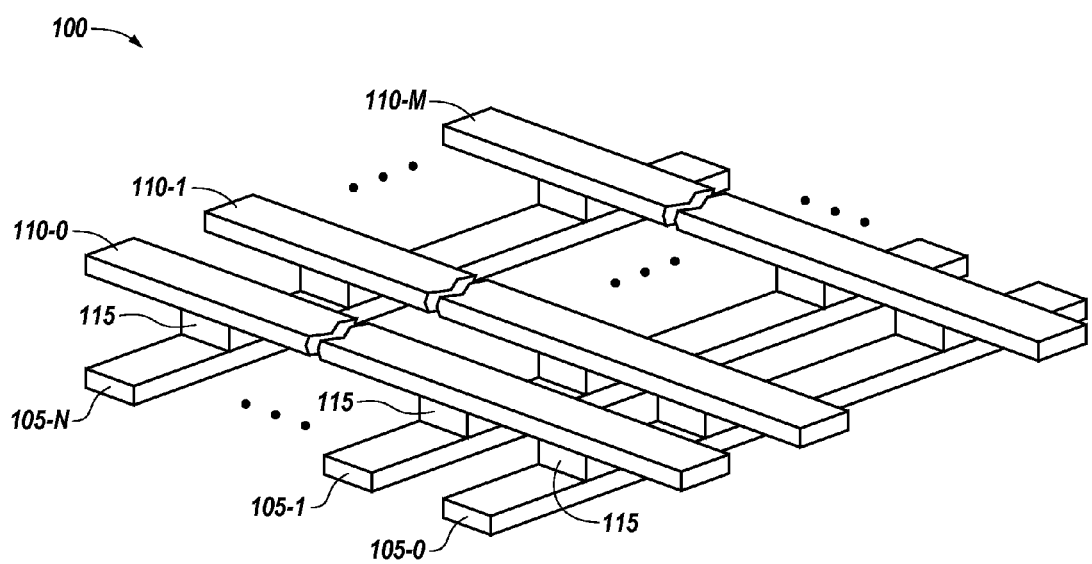
FIG. 1 illustrates an example of a portion of a memory array associated with operating memory cells in accordance with one or more embodiments of the present disclosure.

Methods, devices, and systems associated with memory cell operation are described herein. One or more methods of operating a memory cell include charging a capacitor coupled to the memory cell to a particular voltage level and programming the memory cell from a first state to a second state by controlling discharge of the capacitor through a resistive switching element of the memory cell.

Embodiments of the present disclosure can provide benefits such as greater control of the amount of charge through a memory cell (e.g., resistive memory cell), among other benefits. In one or more embodiments, a parasitic capacitance associated with the memory cell can be charged to a known, finite charge, which can then be discharged through the memory cell in a controlled manner. In one or more embodiments, a capacitor external to the array of resistive memory cells can be used to program the memory cells to multiple resistance levels.

Controlling the amount of charge (e.g., current) through resistive memory cells via embodiments described herein can be used to control the transition of resistive switching elements from a first state (e.g., a high resistance state (HRS), which may be referred to as an "OFF" state), to a second state (e.g., a low resistance state (LRS), which may be referred to as an "ON" state). As used herein, the terms "low" and "high" are used to denote the relative resistance level associated with particular states and does not imply particular resistance values. Programming resistive memory cells in accordance with embodiments described herein can increase the ability to accurately control the programmed resistance of the cells and can provide for MLC programming capability of the cells, among other benefits.

In the following detailed description of the present disclosure, reference is made to the accompanying drawings that for a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Similar elements or components between different figures may be identified by the use of similar digits. For example, 115 may reference element "15" in FIG. 1, and a similar element may be referenced as 215 in FIG. 2. Also, as used herein, "a number of" a particular element and/or feature can refer to one or more of such elements and/or features.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates an example of a portion of a memory array 100 in accordance with one or more embodiments of the present disclosure. In the example illustrated in FIG. 1, the array 100 is a cross point array 100 including a first number of conductive lines 105-0, 105-1, . . . 105-N and a second number of conductive lines 110-0, 110-1, . . . 110-M. The conductive lines 105-0, 105-1, . . . 105-N can be access lines, which may be referred to herein as world lines. The conductive lines 110-0, 110-1, . . . 110-M can be data/sense lines, which may be referred to herein as bit lines. As illustrated, the word lines 105-0, 105-1, . . . 105-N are substantially parallel to each other and are substantially orthogonal to the bit lines 110-0, 110-1, . . . 110-M, which are substantially parallel to each other; however, embodiments are not so limited.

A memory cell 115 is located at each of the intersections of the word lines 105-0, 105-1, . . . , 105-N and bit lines 110-0, 110-1, . . . 110-M. The memory cells 115 can be resistive memory cells operated in accordance with embodiments described herein. Although embodiments are not so limited, the memory cells 115 can function in a two-terminal architecture (e.g., with a particular word line 105-0, 105-1, . . . 105-N and bit line 110-0, 110-1, . . . 110-M serving as a bottom and top electrode).

The memory cells 115 can be RRAM cells, CBRAM cells, and/or PCRAM cells, among other types of resistive memory cells. In various embodiments, the memory cells 115 can have a "stack" structure that includes a select device (e.g., an access device such as a diode) coupled to a storage element (e.g., resistive switching element). A resistive switching element can include a programmable portion of the memory cell 115 (e.g., the portion programmable to a number of different resistance levels corresponding to different data states). The resistive switching effects associated with the memory cells 115 can include, but are not limited to, nanomechanical memory effect, molecular switching effects, electrostatic/electronic effects, electrochemical metallization effect, valency change memory effect, thermochemical memory effect, phase change memory effect, magnetoresistive memory resistive effect, and ferroelectric tunneling, among others. A resistive switching element can include, for instance, one or more resistance variable materials such as a transition metal oxide material, a perovskite, a chalcogenide, or an electrolyte between an anode and cathode, among others. Embodiments are not limited to a particular resistive variable material or materials associated with the resistive switching elements of the memory cells 115. Other examples of resistive variable materials that can be used to form resistive switching elements include binary metal oxide materials, colossal magnetoresistive materials, and/or various polymer based resistive variable materials, among others. The memory cells 115 of array 100 can be operated by applying a voltage (e.g., a write voltage) across the memory cells 115 to program the memory cells 115 to a desired state via selected word lines 105-0, 105-1, . . . 105-N and bit lines 110-0, 110-1, . . . 110-M. The width and/or magnitude of the voltage pulses across the memory cells 115 can be adjusted (e.g., varied) in order to program the memory cells 115 to particular data states (e.g., by adjusting a resistance level of the resistive switching element). Although not illustrated in FIG. 1, the array 100 can be coupled to control circuitry configured to perform one or more embodiments described herein. For instance, the control circuitry can be configured to control programming circuitry in order to program memory cells to desired states by applying appropriate operating voltages to word lines and bit lines associated with the array 100. As an example, in various embodiments, control circuitry can be configured to control charging of one or more capacitors coupled to a memory cell and discharging the one or more capacitors through a resistive switching element of the memory cell in order to program the memory cell in accordance with embodiments described herein.

In resistive memory cells such as Conductive Bridging (CB) or Programmable Metallization Cells (PMC), the switching operation can occur over short time periods (e.g., a few nanoseconds or less). As an example, the transition from an OFF state can occur particularly rapidly as Joule heating and increased electric fields accelerate the transition, which can make it difficult to accurately control programming of the cell to a desired state. Stray capacitance associated with the memory cell (e.g., word line to word line, word line to bit line, and/or bit line to bit line stray capacitance) can increase the difficulty associated with accurately programming the memory cell. For instance, the stray capacitance acts as an energy storage device and as the memory cell transitions (e.g., from an OFF state to an ON state), the stored energy (e.g., charge) discharges through the resistive switching element of the cell, which can present further difficulties with controlling the charge (e.g., current) through the cell. Controlling the programming current through a resistive memory cell can be important in order to tune the ON resistance via programming current variation (e.g., as discussed herein in connection with FIG. 2).

In some instances, a current mirror positioned at the edge of an array of resistive memory cells can be used to control the current through a selected cell (e.g., through the resistive switching element of the cell being programmed). However, in such instances, the current mirror is not able to control stray capacitance within the array (e.g., stray capacitance between the current mirror and the target cell). As such, a current mirror may not be an effective solution for accurately controlling current through a memory cell since stray capacitance also discharges through the cell during programming. In one or more embodiments of the present disclosure, stray capacitance associated with an array of memory cells can be charged to a predetermined voltage and used to accurately control programming current through a selected memory cell.

Figure 2:
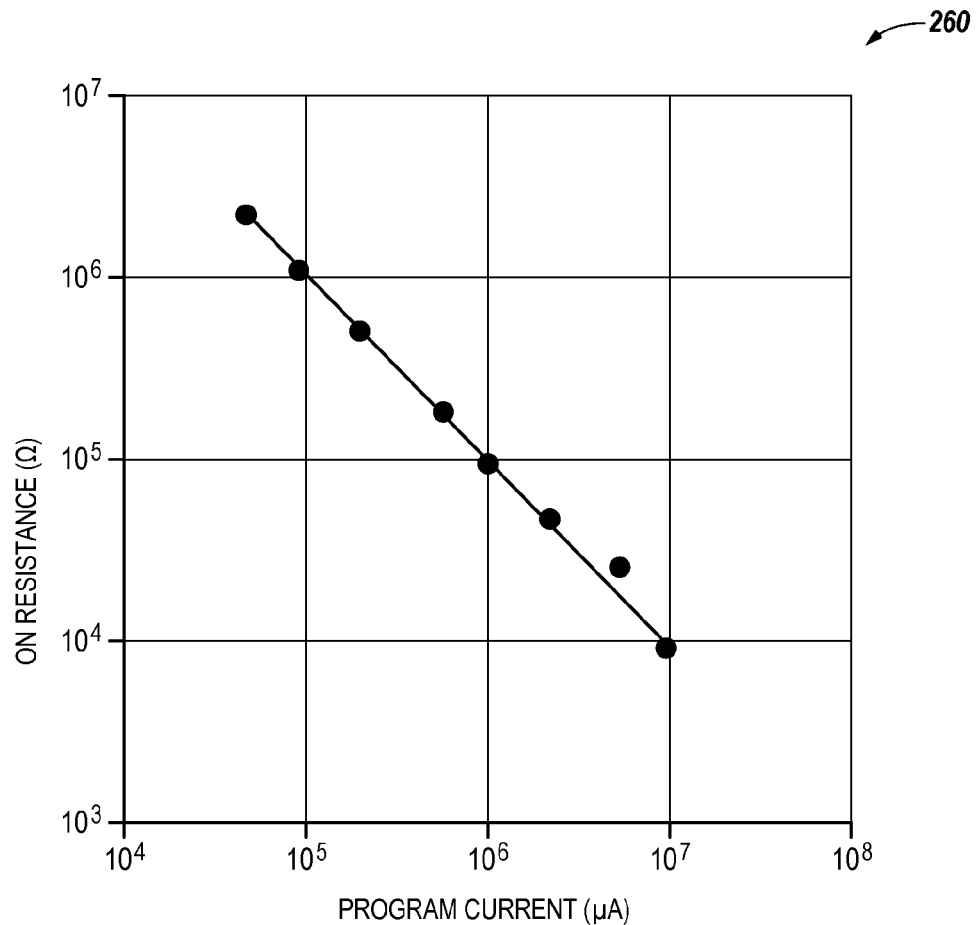
FIG. 2 is a diagram illustrating ON resistance versus programming current associated with operating memory cells in accordance with one or more embodiments of the present disclosure.

FIG. 2 is a diagram illustrating ON resistance versus programming current associated with operating memory cells in accordance with one or more embodiments of the present disclosure. Plot 260 indicates that programming current through a resistive memory cell is directly related to the ON resistance level of the cell. The effects of stray capacitance can be dampened by increasing the program current to achieve a desired, known ON resistance level. However, the energy required to go back to an OFF state is prohibitively high. Embodiments described herein provide greater control of the program current, which implies greater control over the ON resistance level. For instance, a lower program current can be used to achieve a desired, known ON resistance level, which requires less energy to go back to an OFF state. Further, greater control of the program current enables MLC operation within a smaller range of energy levels.

Figure 3:
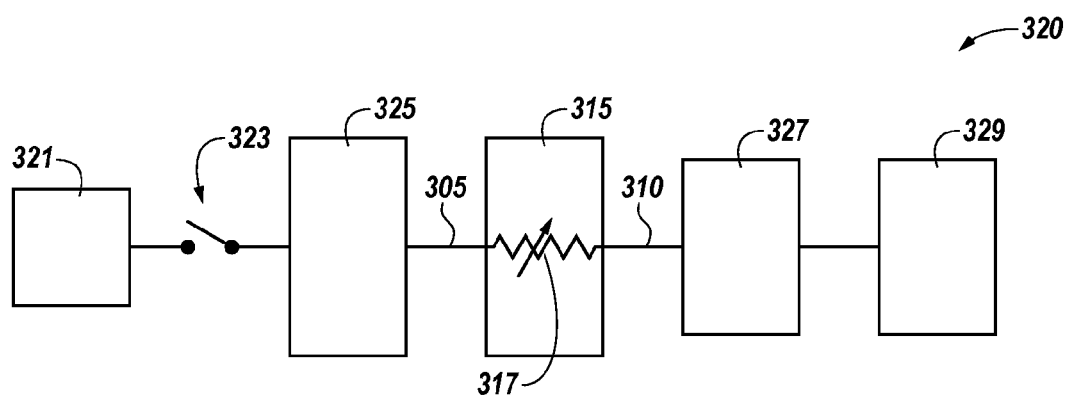
FIG. 3 illustrates a block diagram of a device for operating memory cells in accordance with one or more embodiments of the present disclosure.

FIG. 3 illustrates a block diagram of a device 320 for operating memory cells in accordance with one or more embodiments of the present disclosure. In this example, the device 320 includes a resistive memory cell 315 coupled between an access line, for example, a word line 305 and a data/sense line, for example, a bit line 310 and a resistive switching element 317 within the resistive memory cell 315. The resistive memory cell 315 can be a memory cell such as cell 115 described in FIG. 1.

The device 320 includes a voltage source 321 configured to bias word line 305 coupled to a resistive memory cell 315 during operations such as programming, erasing, and reading operations. As such, the voltage source 321 may be referred to herein as a word line bias or as a word line driver. The device 320 also includes a voltage source 329 configured to bias bit line 310 during operation of the memory cell 315. As such, the voltage source 329 may be referred to herein as a bit line bias or as a bit line driver.

In various embodiments, a memory cell (e.g., 315) can be programmed from a first state (e.g., an OFF state) to a second state (e.g., an ON state) by controlling discharge of a capacitor through a resistive switching element (e.g., 317) of the memory cell. The memory cell 315 can be operated as an SLC or an MLC. For instance, in one or more embodiments, the memory cell can be an MLC programmed from an OFF state to one of at least two different ON states.

Block 325 of device 320 represents a capacitor that can be charged to a particular voltage level via word line bias 321. In the embodiment illustrated in FIG. 3, the capacitor 325 represents a stray capacitance associated with the word line 305. That is, the capacitor 325 includes a parasitic capacitance between the word line 305 and other word lines within the memory array (e.g., word line to word line parasitic capacitance). The capacitor 325 can also include parasitic capacitance between the word line 305 and various bit lines (e.g., bit line 310 and other bit lines) within the array (e.g., word line to bit line parasitic capacitance). As such, the capacitor 325 may be referred to as a word line parasitic capacitor. The capacitance of the capacitor 325 can be determined based on various characteristics of the array such as types of conductive materials used and the types of dielectric material between the conductors, physical dimensions of the word lines and bit lines, and/or spacing of the word lines and bit lines, among other characteristics. Also, the value of the stray capacitance associated with capacitor 325 can be adjusted by controlling characteristics such as cell pitch, interlayer dielectric (ILD) permittivity, and/or block size, among other characteristics. In one or more embodiments, the capacitor 325 can have a capacitance of about 100 fF to 300 fF; however, embodiments are not limited to a particular capacitance associated with capacitor 325. Since the capacitance associated with capacitor 325 can be determined (e.g., a known value), the capacitor 325 can be charged to a known amount of charge.

Block 327 of device 320 represents a capacitor coupled to voltage source 329. In the embodiment illustrated in FIG. 3, the capacitor 327 represents a stray capacitance associated with the bit line 310. That is, the capacitor 327 includes a parasitic capacitance between the bit line 310 and other bit lines within the memory array (e.g., bit line to bit line parasitic capacitance). As such, the capacitor 327 may be referred to as a bit line parasitic capacitor.

The device 320 includes a switch 323 that can be closed to apply the word line bias 321 to word line 305 and opened to remove the word line bias 321 from the word line 305 (e.g., in association with a programming operation performed on a selected cell 315). In an example programming operation, the switch 323 is closed such that the word line parasitic capacitor 325 is charged to a particular voltage level (e.g., about 1V). Initially, the bit line bias 329 is configured such that no potential difference exists across the resistive switching element 317 during charging of the capacitor 325. After the capacitor 325 is charged, the word line bias is adjusted (e.g., removed by opening switch 323) and the bit line bias 329 is adjusted (e.g., reduced) to provide a potential difference across the resistive switching element 317. Due to the potential difference across the resistive switching element 317, the capacitor 327 charges as the capacitor 325 discharges through the resistive switching element 317. As described further below in connection with FIGS. 4 and 5, the magnitude of the current associated with the discharge of the capacitor 325 through the resistive switching element 317 can be controlled by controlling the bit line bias 329 applied to bit line 310. As noted above, controlling the magnitude of the current through the resistive switching element 317 can control the resistance level of the cell 315, which can provide benefits such as enabling MLC capability, among other benefits.

In the example programming operation described above, cell 315 represents a selected memory cell (e.g., a cell selected for programming). As such word line 305 represents a selected word line (e.g., a word line coupled to a selected cell) and bit line 310 represents a selected bit line (e.g., a bit line coupled to a selected cell). As such, the stray capacitance 325 can represent parasitic capacitance between the selected word line 305 and adjacent word lines (e.g., unselected word lines). During a programming operation, the unselected word lines can be tied to ground (e.g., relative to the selected word line). However, embodiments are not so limited. For instance, unselected word lines can be tied to other suitable potentials during a programming operation. Since the stray capacitance 325 represents parasitic capacitance between a selected word line (e.g., 305) and unselected and word lines, the bias applied to the unselected word lines during a programming operation can affect the amount of charge stored by capacitor 325.

Embodiments of the present disclosure are not limited to the example illustrated in FIG. 3. Also, although not shown in FIG. 3, in one or more embodiments, the resistive switching device 317 can be coupled to a select device (e.g., a select transistor), which can be used to decrease current leakage associated with the memory cell 315.

Figure 4:
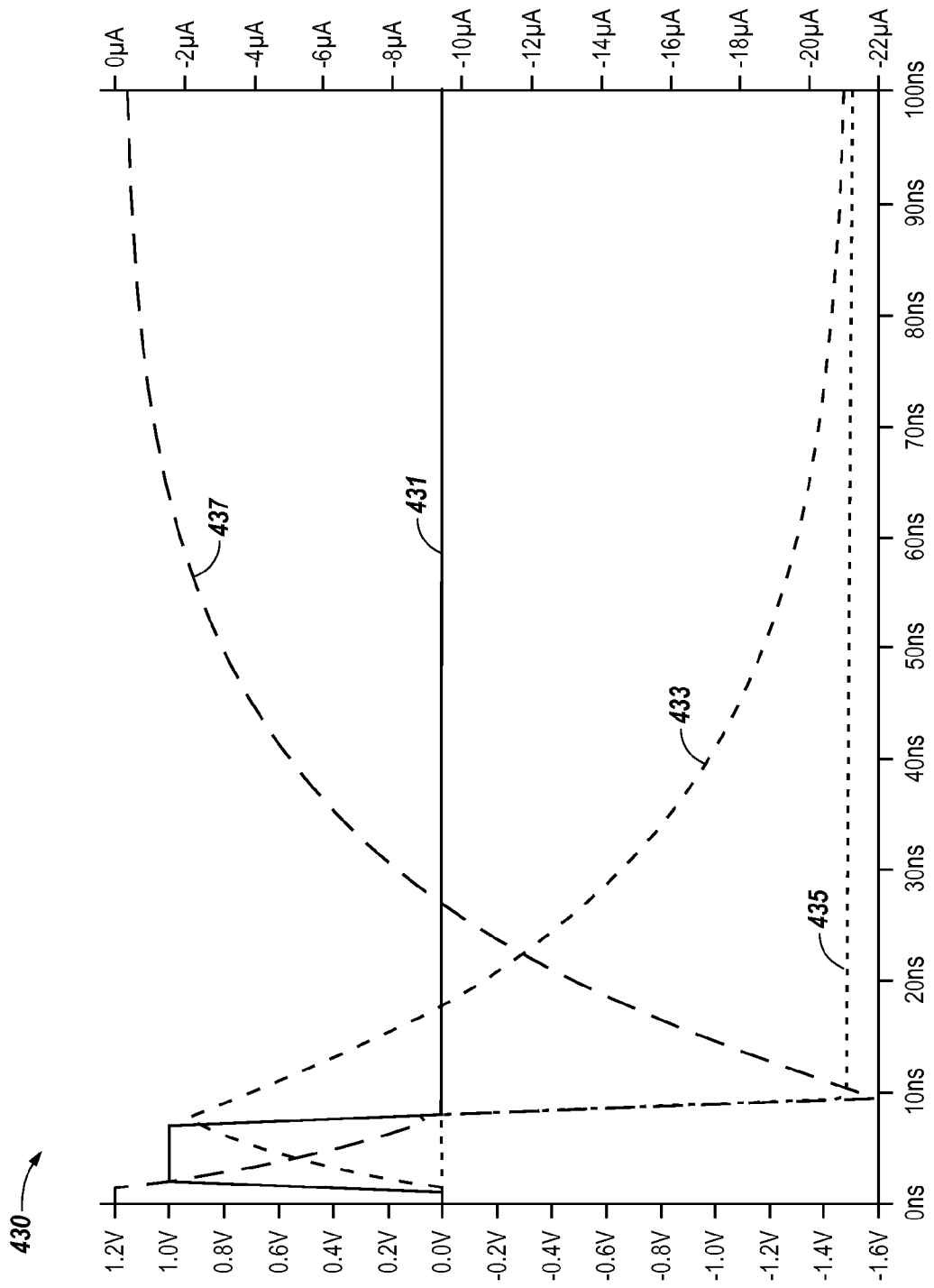
FIG. 4 illustrates an example of a circuit timing diagram associated with operating a memory cell in accordance with one or more embodiments of the present disclosure.

FIG. 4 illustrates an example of a circuit timing diagram 430 associated with operating a memory cell in accordance with one or more embodiments of the present disclosure. The diagram 430 plots time in nanoseconds (ns) on the x-axis, voltage in volts (V) on the left y-axis, and current in microamps (µA), on the right y-axis. Timing diagram 430 includes a number of signals (e.g., current and voltage signals) associated with the memory device 320 illustrated in FIG. 3 during a programming operation in accordance with one or more embodiments of the present disclosure. Voltage signal 431 represents the bias voltage applied to the word line 305 of the selected cell 315 via voltage source 321 as controlled by switch 323. Voltage signal 433 represents the voltage associated with the word line parasitic capacitor 325. Voltage signal 435 represents the voltage applied to the bit line 310 of the selected cell 315 via voltage source 329. Current signal 437 represents the current through the resistive switching element 317 of the selected cell 315 during the programming operation.

As illustrated in diagram 430, at the onset of the programming operation (e.g., at 0 ns), the switch 323 is closed such that a word line bias of about 1V is applied to the word line 305 via the voltage source 321 (as indicated by voltage signal 431). As such, and as indicated by voltage signal 433, the word line parasitic capacitance 325 is charged to a particular voltage (e.g., about 0.9V in this example) corresponding to a particular amount of accumulated charge. In various embodiments, the accumulated charge associated with the parasitic capacitance 325 can be discharged through the resistive element 317 by adjusting the bias applied to the word line 305 and the bias applied to the bit line 310 of the selected memory cell 315 in order to program the memory cell 315 to a particular state (e.g., from an OFF state to one of a number of ON states).

For instance, in the example illustrated in FIG. 4, after the word line parasitic capacitance 325 has been charged to the particular voltage, the switch 323 is opened such that the voltage source 321 is disconnected (e.g., voltage source 321 no longer applies a voltage to the word line 305). As illustrated in diagram 430, the switch 323 is opened at about 9 ns (as indicated by voltage signal 431), at which point the bias applied to the bit line 310 is adjusted to about −1.5V. The voltage difference across the resistive switching element 317 causes the charge accumulated on the parasitic capacitor 325 to discharge through the resistive switching element 317. The current signal 437 indicates the current through the resistive switching element 317 as the capacitor 325 discharges (as indicated by voltage signal 433).

In the example illustrated in FIG. 4, the magnitude of the current through the resistive switching element 317 is about 22 microamps when the potential across the element 317 is adjusted (e.g., by removing application of the word line bias via switch 323 and reducing the bit line bias). As discussed in connection with FIG. 2 and as discussed further below in connection with FIG. 5, the magnitude of the programming current through the resistive switching element 317 can directly affect the resultant resistance state of the memory cell 315. Varying the voltage applied to the bit line 310 during a programming operation can vary the magnitude of the current through the resistive switching element 317. As such, the bit line bias voltage can be adjusted to control the resistance state (e.g., the particular ON resistance state) of the memory cell 315. Consequently, a selected memory cell can be programmed from a first state (e.g., an OFF state) to a desired second state (e.g., an ON state) with greater control, as compared to previous approaches.

Embodiments are not limited to the example bias conditions illustrated in FIG. 4. For instance, in the example illustrated in FIG. 4, the selected cell 315 is shielded from prematurely switching by biasing the selected bit line 310 at 0V. The bit line bias is then pulled to −1.5V to promote discharge from capacitor 325 through the cell 315. In a number of embodiments, other biasing conditions can be used to prevent the cell 315 from switching states prematurely (e.g., prior to the capacitance 325 being charged to a desired level). For instance, in a number of embodiments, the selected bit line 310 can be floated (e.g., by placing a high impedance between the bit line 310 and the bit line bias 329) while the parasitic capacitance 325 is charging. As another example, the bit line can be biased at a potential equal to about half of the word line bias potential during charging of the parasitic capacitance 325.

Figure 5:
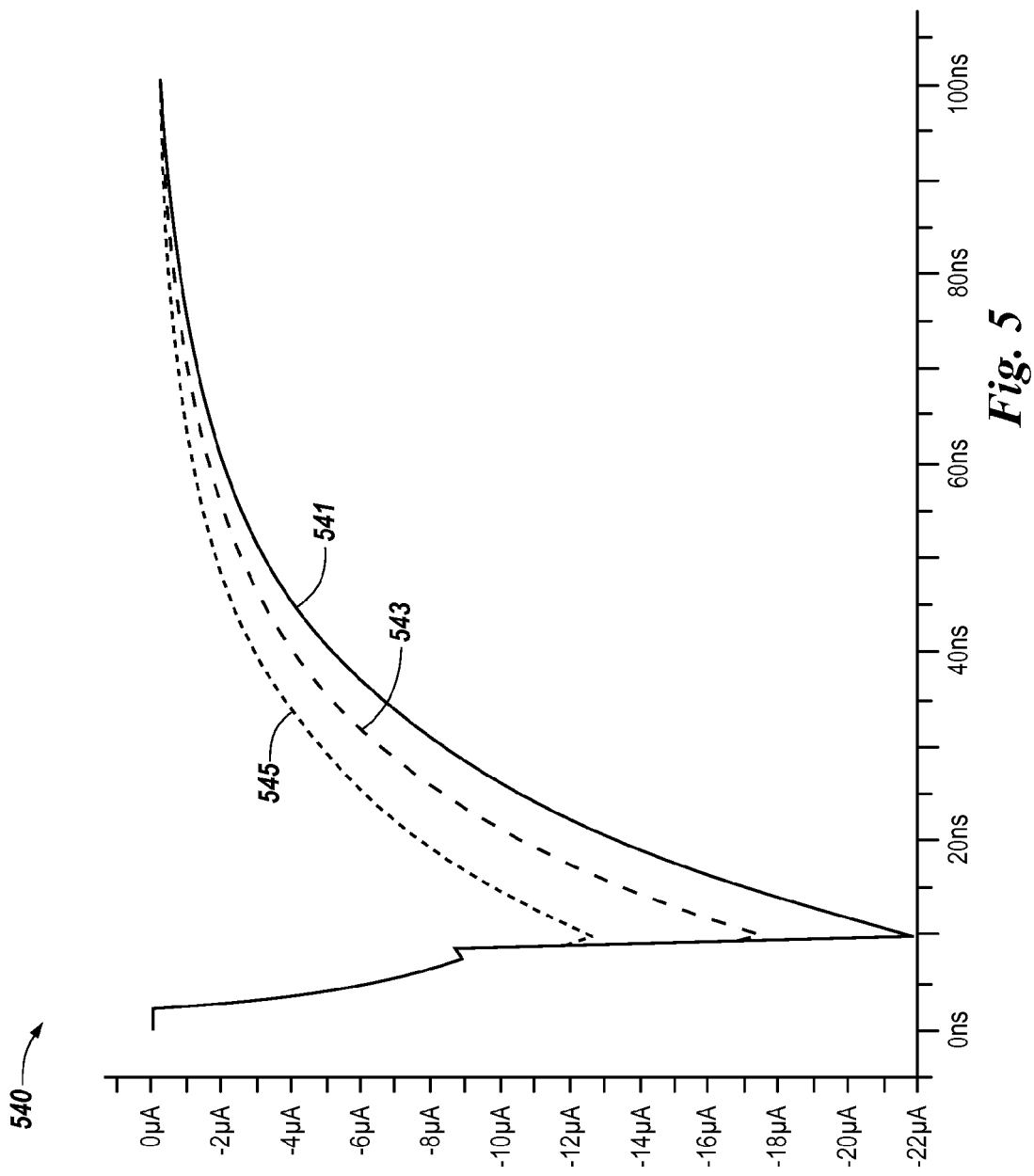
FIG. 5 is a timing diagram illustrating current through a memory element for a number of different bit line bias voltages in accordance with one or more embodiments of the present disclosure.

FIG. 5 is a timing diagram 540 illustrating current through a resistive memory element for a number of different bit line bias voltages in accordance with one or more embodiments of the present disclosure. The diagram 430 plots time in nanoseconds (ns) on the x-axis and current in microamps (μA) on the y-axis. Timing diagram 540 includes a number of current signals 541, 543, and 545 associated with operating (e.g., programming) a resistive memory cell in accordance with one or more embodiments of the present disclosure.

In the example illustrated in FIG. 5, each of the current signals 541, 543, and 545 correspond to a different bias voltage applied to a bit line coupled to a selected memory cell being programmed (e.g., from an OFF state to an ON state). Applying different bias voltages to the bit line of a selected cell (e.g., 315) varies the potential difference across the resistive switching element (e.g., 317) and leads to different current magnitudes through the resistive switching element. Since the programming current magnitude directly affects the resultant resistance state of the cell, controlling the programming current magnitude (e.g., via controlling the bit line bias voltage) can be used to achieve a desired resistance state of the memory cell.

In this example, current signal 541 can be analogous to current signal 437 shown in FIG. 4. As such, the current signal 541 corresponds to an applied bit line bias voltage of about −1.5V. Current signal 543 can correspond to an applied bit line bias voltage of about −1.0V, and current signal 545 can correspond to an applied bit line bias voltage of about −0.5V. As will be appreciated, an increased potential difference across the resistive switching element (e.g., the voltage difference between the voltage of the charged capacitor 325 and the bit line bias voltage) results in an increased programming current magnitude through the resistive switching element 317. As such, an increased bit line bias voltage magnitude results in an increased programming current magnitude through the resistive switching element 317. For instance, in this example, the applied bias voltage of about −1.0V results in a programming current magnitude of about 17 microamps (as indicated by current signal 543) and the applied bias voltage of about −0.5V results in a programming current magnitude of about 12 microamps (as indicated by current signal 545). Each of the different resulting current magnitudes can correspond to a different program state (e.g., a different resistance level) of the memory cell 315. As such, by adjusting the bit line bias, the selected memory cell can be programmed to multiple states.

Figure 6:
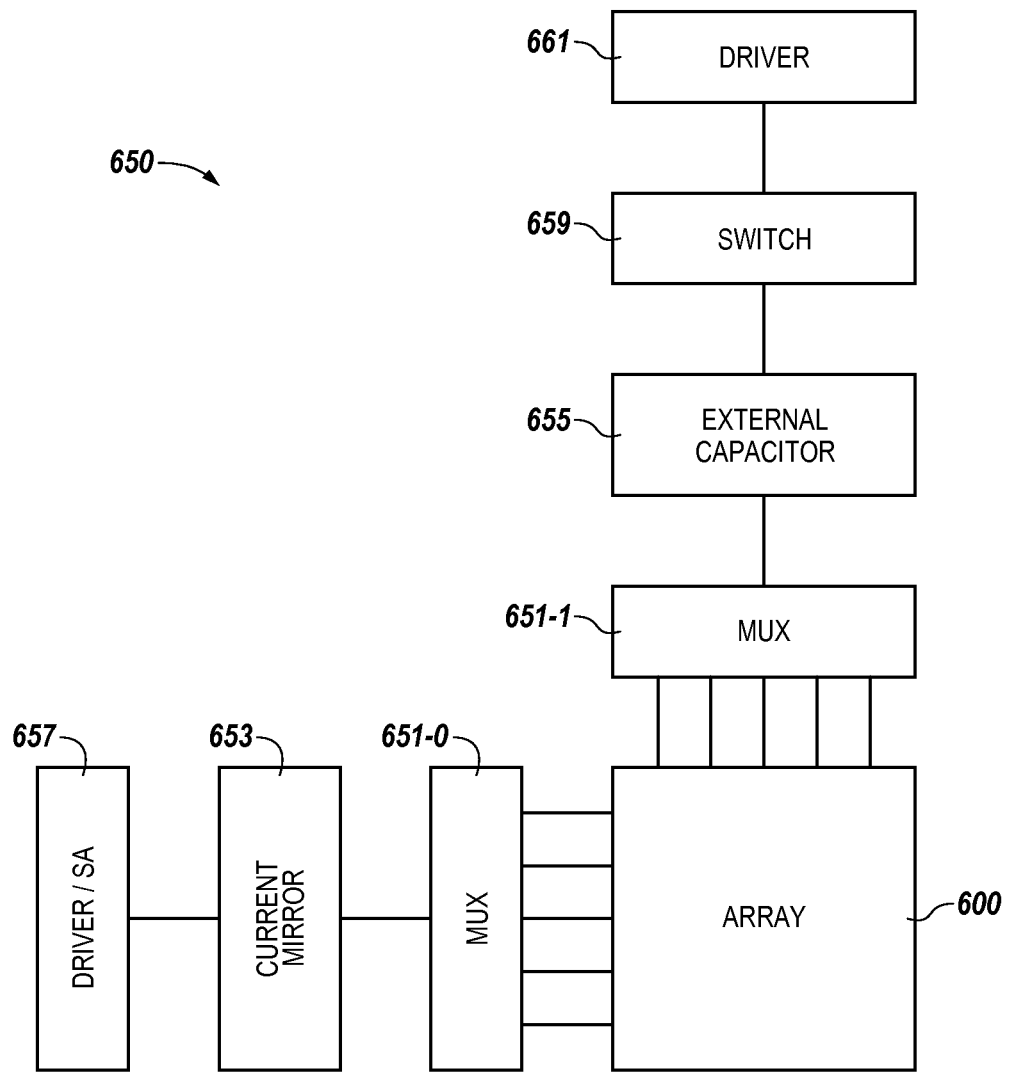
FIG. 6 illustrates a memory device for operating memory cells in accordance with one or more embodiments of the present disclosure.

FIG. 6 illustrates a memory device 650 for operating (e.g., programming) memory cells in accordance with one or more embodiments of the present disclosure. Memory device 650 includes an array 600 of resistive memory cells. The array 600 can be a cross-point array such as array 100 illustrated in FIG. 1.

The device 650 includes a current mirror 653 coupled to the array 600. In this example, the current mirror 653 is coupled to the array 600 via a multiplexer 651-0. A driver/sense amp 657 is coupled to the current mirror 653. In one or more embodiments, the driver/sense amp 657 can be used to bias bit lines during memory operations and to sense the bit during a memory operations. The current mirror 653 can be used to provide operational compliance (e.g., to avoid over-programming) of a selected memory cell (e.g., 115, 315). For example, over programming can be avoided by the current mirror 653 limiting current into the array 600. Although the current mirror 653 is coupled to bit lines of the array 600, embodiments are not so limited. For instance, a current mirror can be coupled to word lines of the array 600. Since, in various embodiments, a selected bit line may be biased at a potential closer to a ground than a potential to which a selected word line is biased, coupling the current mirror 653 to the bit lines may provide increased control as compared to control provided by a current mirror coupled to the word lines.

The device 650 includes an external capacitor 655 coupled to the array 600. In this example, the external capacitor 655 is coupled to the array 600 via a multiplexer 651-1. In one or more embodiments, the multiplexer 651-0 and/or 651-1 can act as tri-state devices. The device 650 includes a switch 659 coupled between the external capacitor 655 and a driver 661 (e.g., a word line driver). In one or more embodiments, the driver 661 can charge the external capacitor 655 in association with a programming operation performed on a selected memory cell of array 600. In various embodiments, the external capacitor 655 is charged concurrently with a word line parasitic capacitance associated with the selected cell (e.g., parasitic capacitance 325 shown in FIG. 3). Charging of the external capacitor 655 and the word line parasitic capacitance can be performed while preventing the selected memory cell from switching. Methods of preventing the selected memory cell from switching can include biasing the selected bit line (e.g., 310) of the selected cell at zero volts during charging of the capacitor 655 and tri-stating the selected bit line (e.g., such that the selected bit line "floats") during charging of the capacitor 655, among others.

The external capacitor 655 and parasitic capacitance can be charged to a particular (e.g., known) amount of charge. The known amount of charge associated with the combined external capacitor and parasitic capacitance can then be discharged through the selected memory cell to program the selected cell in accordance with embodiments described herein. In various embodiments, while the external capacitor 655 discharges through the selected cell, it is disconnected (e.g., isolated) from the driver 661 to prevent undesired application of bias thereto during the programming operation. The external capacitor can be disconnected from the driver 661 via a switch 659 (e.g., as shown in FIG. 6) or other suitable means. For example, a current mirror can be used to isolate the external capacitor 655 from the driver 661.

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

Throughout the specification and claims, the meanings identified below do not necessarily limit the terms, but merely provide illustrative examples for the terms. The meaning of "a," "an," and "the" includes plural reference, and the meaning of "in" includes "in" and "on." The term "a number of" is meant to be understood as including at least one but not limited to one. The phrase "in an example" and "in an embodiment," as used herein does not necessarily refer to the same example/embodiment, although it can.

In the foregoing Detailed Description, various features are grouped together in a single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed is:

1. A method for operating a memory cell, comprising:
   charging a capacitor coupled to the memory cell to a particular voltage level; and
   programming the memory cell from a first state to a second state by controlling discharge of the capacitor through a resistive switching element of the memory cell, wherein the discharge of the capacitor provides a magnitude of current sufficient to program the memory cell from the first state to the second state, wherein the capacitor is a stray capacitance, wherein the stray capacitance includes a word line parasitic capacitance associated with the memory cell.

2. The method of claim 1, wherein the second state is one of at least two states corresponding to different resistances.

3. The method of claim 1, wherein controlling the discharge of the capacitor includes adjusting a voltage difference across the resistive switching element.

4. The method of claim 3, wherein adjusting the voltage difference across the resistive switching element includes adjusting a bit line bias associated with the memory cell.

5. A method of operating a memory cell, comprising:
   charging a first parasitic capacitance associated with the memory cell by applying a first bias to an access line coupled to the memory cell; and discharging the first parasitic capacitance through a resistive switching element of the memory cell by adjusting a second bias applied to a sense line coupled to the memory cell and adjusting the first bias in order to program the memory cell, wherein the discharge of the first parasitic capacitance provides a magnitude of current sufficient to program the memory cell from a first state to a second state, wherein adjusting the first bias includes no longer applying the first bias to the access line, wherein adjusting the first bias includes opening a switch located between a first bias source and the resistive switching element.

6. The method of claim 5, including charging the first parasitic capacitance to a predetermined voltage level.

7. The method of claim 5, wherein discharging the first parasitic capacitance through the resistive switching element includes charging a second parasitic capacitance associated with the memory cell.

8. The method of claim 7, wherein the first parasitic capacitance is a word line parasitic capacitance and the second parasitic capacitance is a bit line parasitic capacitance.

9. The method of claim 5, wherein the the first state and the second state are two of a number of different states each having a different resistance associated therewith and wherein the method includes adjusting the second bias based on one of the number of different states.

10. The method of claim 5, including adjusting the second bias to a particular voltage level to achieve a desired charge through the resistive switching element.

11. The method of claim 5, including decreasing current leakage associated with the memory cell via a select device coupled to the resistive switching element.

12. A method for operating an array of memory cells, comprising:
    charging a capacitor located external to the array to a particular voltage level; and controlling discharge of the capacitor through a resistive switching element of a selected memory cell to program the selected memory cell, wherein the discharge of the capacitor provides a magnitude of current sufficient to program the selected memory cell from a first state to a second state, including charging the external capacitor concurrently with charging a word line parasitic capacitance associated with the selected memory cell, including charging the capacitor using a word line driver and disconnecting the word line driver from the capacitor prior to discharging the capacitor through the resistive switching element of the selected cell.

13. The method of claim 12, including floating a selected bit line corresponding to the selected cell during the charging of the capacitor.

14. A memory device, comprising:
an array of memory cells; and
control circuitry coupled to the array to charge a capacitor coupled to a selected memory cell to a particular voltage level; and
program the selected memory cell from a first state to a second state by controlling discharge of the capacitor through a resistive switching element of the selected memory cell, wherein the discharge of the capacitor provides a magnitude of current sufficient to program the selected memory cell from the first state to the second state, wherein the control circuitry is configured to adjust a first bias applied to an access line of the selected memory cell, wherein adjusting the first bias includes opening a switch located between a first bias source and the resistive switching element.

15. The memory device of claim 14, wherein the control circuitry is configured to adjust a second bias applied to a sense line of the selected memory cell.

16. The memory device of claim 14, wherein the second state is one of at least two states corresponding to different resistances, with each of the different resistances being lower than a resistance corresponding to the first state.

17. The memory device of claim 14, wherein the capacitor is located external to the array.

18. The memory device of claim 14, wherein the capacitor is a word line parasitic capacitance associated with the selected memory cell.

19. The memory device of claim 18, including a bit line parasitic capacitance associated with the selected memory cell, wherein the bit line parasitic capacitance charges as the word line parasitic capacitance discharges.

20. The memory device of claim 14, wherein the array is a cross point array.

21. A memory device, comprising:
an array of memory cell; and
control circuitry coupled to the array to charge a first parasitic capacitance associated with a selected memory cell by applying a first bias to an access line of the selected memory cell; and
discharge the first parasitic capacitance through a resistive switching element of the selected memory cell by adjusting a second bias applied to a sense line coupled to the memory cell and by adjusting the first bias in order to program the selected memory cell, wherein the discharge of the first parasitic capacitance provides a magnitude of current sufficient to program the memory cell from a first state to a second state, wherein a switch is located between a source of the first bias and the selected memory cell, and wherein the switch is opened to adjust the first bias, wherein the first parasitic capacitance is a word line parasitic capacitance including a word line to word line parasitic capacitance and a word line to bit line parasitic capacitance.

22. The memory device of claim 21, wherein the selected memory cell is a conductive bridging cell.

23. The memory device of claim 21, wherein the selected memory cell is a phase change memory cell.

24. A memory device, comprising:
an array of memory cells;
an external capacitor coupled to the array and configured to discharge a predetermined amount of charge through a resistive switching element of a selected memory cell to program the selected cell from a first state to a second state, wherein the discharge of the external capacitor provides a magnitude of current sufficient to program the memory cell from the first state to the second state, including a switch coupled between the external capacitor and a word line driver, wherein the switch is configured to disconnect the word line driver from the external capacitor during discharge of the predetermined amount of charge.

25. The memory device of claim 24, including a word line driver coupled to the external capacitor and configured to charge the external capacitor to the predetermined amount of charge.

26. The memory device of claim 24, wherein the first state corresponds to an uppermost resistance level associated with the memory cells, and wherein the second state corresponds to one of a number of lower resistance levels associated with the memory cells.

27. The memory device of claim 24, including a current mirror coupled to the array to provide a current compliance.

28. The memory device of claim 24, wherein the external capacitor is coupled to the array via a multiplexer.

* * * * *

UNITED STATES PATENT AND TRADEMARK OFFICE
CERTIFICATE OF CORRECTION

PATENT NO. : 8,665,630 B2  Page 1 of 1
APPLICATION NO. : 13/117889
DATED : March 4, 2014
INVENTOR(S) : Roy E. Meade et al.

It is certified that error appears in the above-identified patent and that said Letters Patent is hereby corrected as shown below:

In the Claims

In column 10, line 46, in Claim 9, delete "the the" and insert -- the --, therefor.

Signed and Sealed this
Fourth Day of November, 2014

Michelle K. Lee
*Deputy Director of the United States Patent and Trademark Office*